(12) United States Patent
Mori

(10) Patent No.: US 7,695,570 B2
(45) Date of Patent: *Apr. 13, 2010

(54) PROCESSING-SUBJECT CLEANING METHOD AND APPARATUS, AND DEVICE MANUFACTURING METHOD AND DEVICE

(75) Inventor: Yoshiaki Mori, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 749 days.

This patent is subject to a terminal disclaimer.

(21) Appl. No.: 11/368,375

(22) Filed: Mar. 7, 2006

(65) Prior Publication Data

US 2006/0144428 A1 Jul. 6, 2006

Related U.S. Application Data

(62) Division of application No. 10/366,664, filed on Feb. 14, 2003, now Pat. No. 7,282,098.

(30) Foreign Application Priority Data

Mar. 15, 2002 (JP) ............................... 2002-73071

(51) Int. Cl.
   *B08B 3/00* (2006.01)
   *B08B 5/04* (2006.01)
(52) U.S. Cl. .............................. 134/26; 134/34; 134/36
(58) Field of Classification Search ....................... None
   See application file for complete search history.

(56) References Cited

U.S. PATENT DOCUMENTS

| | | | | |
|---|---|---|---|---|
| 5,415,191 A | * | 5/1995 | Mashimo et al. | 134/102.1 |
| 6,132,522 A | * | 10/2000 | Verhaverbeke et al. | 134/26 |
| 6,253,462 B1 | | 7/2001 | Schwarz | |
| 6,365,531 B1 | | 4/2002 | Hayashi et al. | |
| 6,599,582 B2 | | 7/2003 | Kiguchi et al. | |
| 6,730,176 B2 | * | 5/2004 | Kuyel | 134/1 |
| 2002/0035762 A1 | * | 3/2002 | Okuda et al. | 15/77 |
| 2002/0062841 A1 | * | 5/2002 | Twu et al. | 134/3 |
| 2003/0102013 A1 | | 6/2003 | Jackson | |

(Continued)

FOREIGN PATENT DOCUMENTS

EP      0 587 889 A1      3/1994

(Continued)

*Primary Examiner*—Michael Cleveland
*Assistant Examiner*—Nicole Blan
(74) *Attorney, Agent, or Firm*—Oliff & Berridge, PLC

(57) ABSTRACT

The invention reduces the amounts of cleaning liquids and rinse liquid used, as well as the energy consumption. A cleaning head has a plurality of cleaning units and a drying unit. An organic substance cleaning portion of each cleaning unit blows a first cleaning agent selectively over a portion to be cleaned of a substrate, and sucks reaction products etc. through a first suction mouth. An inorganic substance cleaning portion blows a second cleaning agent over the portion to be cleaned of the substrate from which organic substance have been removed, and sucks reaction products etc. through a second suction mouth. A rinse portion blows pure water the portion of the substrate from which inorganic substance have been removed, and sucks its vapor through a third suction mouth. The drying unit dries the substrate by blowing out a heated gas from a hot wind blowing-out mouth. A light guide illuminates the portion to be cleaned of the substrate with ultraviolet light, and thereby decomposes residual organic substances.

6 Claims, 4 Drawing Sheets

12 : CLEANING HEAD    60 : DRYING UNIT
50 : CLEANING UNIT    61 : HOT WIND BLOWING-OUT MOUTH
52 : ORGANIC SUBSTANCE CLEANING PORTION
54 : INORGANIC SUBSTANCE CLEANING PORTION
56 : RINSE PORTION

U.S. PATENT DOCUMENTS

2004/0082183 A1    4/2004   Mori

FOREIGN PATENT DOCUMENTS

| JP | 62150828 | 7/1987 |
| JP | A-62-188322 | 8/1987 |
| JP | A-01-226156 | 9/1989 |
| JP | 03058417 | 3/1991 |
| JP | A-04-354334 | 12/1992 |
| JP | A-07-241501 | 9/1995 |
| JP | A-08-264923 | 10/1996 |
| JP | A-10-092784 | 4/1998 |
| JP | 10242111 | 9/1998 |
| JP | A-11-008213 | 1/1999 |
| JP | A-11-204529 | 7/1999 |
| JP | A-2000-349059 | 12/2000 |
| JP | A-2002-009037 | 1/2002 |

* cited by examiner

| 12 : | CLEANING HEAD | 60 : | DRYING UNIT |
| --- | --- | --- | --- |
| 50 : | CLEANING UNIT | 61 : | HOT WIND BLOWING-OUT MOUTH |
| 52 : | ORGANIC SUBSTANCE CLEANING PORTION | | |
| 54 : | INORGANIC SUBSTANCE CLEANING PORTION | | |
| 56 : | RINSE PORTION | | |

PROCESSING-SUBJECT CLEANING METHOD AND APPARATUS, AND DEVICE MANUFACTURING METHOD AND DEVICE

This is a Division of application Ser. No. 10/366,664 filed Feb. 14, 2003 now U.S. Pat. No. 7,282,098. The entire disclosure of the prior application is hereby incorporated by reference herein its entirety.

BACKGROUND OF THE INVENTION

1. Field of Invention

The present invention relates to a method for cleaning a semiconductor substrate, a glass substrate or the like. In particular, the invention relates to a processing-subject cleaning method and apparatus suitable for cleaning a substrate on which patterns of circuit elements, interconnections, etc. are to be formed, and a device manufacturing method and a device.

2. Description of Related Art

In general, in forming patterns to provide circuit elements etc. on a substrate such as a semiconductor substrate or a glass substrate, the patterns are formed after cleaning the substrate. This is because, for example, if organic or inorganic stains exist on the surface of a substrate, they may prevent formation of patterns or impair the electrical characteristics of patterns formed. Usually, a substrate is cleaned by one of the following three processes, in each of which the cleaning efficiency is increased by controlling the temperature of a cleaning liquid (cleaning agent) to between 20° C. and 70° C.

The substrate is cleaned by using pure water or an organic solvent, and then dried.

After organic substances on the surface of the substrate are peeled off by using peeling liquid, inorganic substances are etched away with an acid solution, an alkaline solution or the like. Further, the substrate is rinsed with pure water, and then dried.

After the peeling-off of organic substances and the etching-away of inorganic substances of the above (2) are repeated certain times, the substrate is rinsed with pure water, and then dried.

SUMMARY OF THE INVENTION

In each of the above cleaning processes, conventionally, the substrate is immersed in a peeling liquid, an acid solution, an alkaline solution or the like as a cleaning liquid (cleaning agent). And the substrate is immersed in a rinse liquid, or the entire substrate is rinsed with a rinse liquid. As such, in the conventional cleaning, large amounts of cleaning liquids and rinse liquid are required because the entire substrate is cleaned. Further, in the conventional cleaning, since the entire substrate is cleaned, stains, once removed by cleaning from portions where no patterns will be formed, may stick to pattern-forming portions, which makes it necessary to rinse off the stains stuck to the pattern-forming portions with a large amount of rinse liquid. Thus, the cleaning of substrates requires much time and a great cost and puts heavy loads on the environment. Furthermore, the conventional cleaning consumes much energy to maintain prescribed temperatures of large amounts of cleaning liquids and rinse liquid. In addition, in the conventional cleaning, large cleaning tanks capable of immersing the substrate come to be needed as the substrate becomes larger. And the substrate needs to be moved between each of cleaning tanks by a transport apparatus. Therefore, cleaning equipment (cleaning facilities) is large sized and requires a large installation space.

The present invention has been made to solve the above problems in the conventional art, and an object of the invention is therefore to reduce the amounts of cleaning liquids and rinse liquid used as well as the energy consumption.

Another object of the invention is to decrease the scale of facilities and thereby save the space.

To attain the above objects, a substrate cleaning method according to the invention is characterized by blowing a cleaning liquid selectively over a portion to be cleaned of a processing-subject by liquid jetting means, sucking away the cleaning liquid, and drying the portion to be cleaned.

The invention, which is configured as above, can reduce the amount of cleaning liquid used to a large extent because the cleaning is performed by blowing the cleaning liquid selectively over only to the portion to be cleaned of the processing-subject such as a substrate that needs to be cleaned. Further, since it is not necessary to keep constant the temperature of a large amount of cleaning liquid, the energy consumption can also be reduced.

A substrate cleaning method according to the invention is characterized by comprising: an organic substance removing step of removing an organic substance by blowing a first cleaning agent selectively over a pattern-forming portion of a processing-subject; an inorganic substance removing step of removing an inorganic substance by blowing a second cleaning agent selectively over the pattern-forming portion; a rinse step of blowing a rinse liquid selectively over the pattern-forming portion and removing the rinse liquid; and a drying step of drying a portion over which the rinse liquid was blown, and the substrate cleaning method further characterized in that at least one of the organic substance removing step, the inorganic substance removing step, and the rinse step is performed by liquid jetting means.

This invention can reduce the amounts of cleaning liquids and rinse liquid used to a large extent because the cleaning is performed by blowing the first cleaning agent for removing organic substances, the second cleaning agent for removing inorganic substances, and the rinse liquid, selectively over only the pattern-forming portion that needs to be cleaned of the processing-subject such as a substrate. Further, since no large cleaning tanks or substrate transport apparatus is needed even if the substrate (processing-subject) becomes large, the energy consumption and the amount of generation of liquid wastes can be reduced. For example, a peeling liquid for peeling off an organic film or ozone water for oxidizing organic substances can be used as the first cleaning agent. An etching liquid such as an aqueous solution of HF can be used as the second cleaning agent.

The rinse step may be executed after each of the organic substance removing step and the inorganic substance removing step has been executed plural times. This makes it possible to reliably remove difficult-to-remove stains that cannot be removed by a single cleaning operation.

The first cleaning agent may be a mixture of a first reactive gas, capable of reacting with the organic substance, and a first dissolving liquid, capable of dissolving the first reactive gas in itself. Employing, as the first cleaning agent, a mixture of the first reactive gas and the first dissolving liquid, that is, a gas/liquid mixture, makes it possible to supply a large amount of substance that reacts with organic substances such as a substance that oxidizes organic substances, whereby organic substances can be removed more quickly. The second cleaning agent may be a mixture of a second reactive gas, capable of reacting with the inorganic substance, and a second dissolving liquid, capable of dissolving the second reactive gas in itself. This makes it possible to increase the amount of substance, which reacts with inorganic substances, to be used for etching inorganic substances, and thereby remove inorganic substances quickly.

The first cleaning agent may be a first reactive gas that is blown over the pattern-forming portion and can react with the organic substance, and a first dissolving liquid that is blown over the pattern-forming portion and can dissolve the first reactive gas in itself. This makes it possible to increase the amount of substance that reacts with organic substances. The second cleaning agent may be a second reactive gas that is blown over the pattern-forming portion and can react with the inorganic substance, and a second dissolving liquid that is blown over the pattern-forming portion and can dissolve the second reactive gas in itself. This makes it possible to increase the amount of supply of a substance that reacts with (i.e., etches) inorganic substances, and thereby increase the rate of removal of inorganic substances. Further, the nozzles etc. for jetting out liquids are prevented from being damaged by cleaning liquids (etching liquids) etc.

The drying may be performed by blowing a heated gas. Blowing a heated gas accelerates the evaporation of the rinse liquid, and thereby enables fast drying. Further, since the heated gas is blown over only the pattern-forming portion of the substrate, the energy that is consumed for the drying can be reduced to a large extent.

The gas may be a third reactive gas capable of oxidizing the organic substance. Performing the drying by heating the third reactive gas such as a gas containing ozone or excited oxygen and blowing it makes it possible to remove organic substances remaining on the substrate. An inert gas such as nitrogen may be used as the gas if necessary. Where the substrate is made of a material that is prone to oxidize, blowing an inert gas can prevent oxidation of the substrate, and thereby can maintain a clean state after cleaning reliably. Further, the drying may be performed while the pattern-forming portion is illuminated with ultraviolet light. Applying ultraviolet light makes it possible to decompose and remove organic substances remaining in the pattern-forming portion.

A cleaning apparatus according to the invention for practicing the above processing-subject cleaning method is characterized by comprising: a cleaning head that is moved relative to a processing-subject; moving means for moving the cleaning head; first jetting means provided in the cleaning head, for jetting out a first cleaning agent capable of removing an organic substance; first sucking means provided in the vicinity of the first jetting means, for sucking the first cleaning agent; second jetting means provided in the cleaning head, for jetting out a second cleaning agent capable of removing an inorganic substance; second sucking means provided in the vicinity of the second jetting means, for sucking the second cleaning agent; third jetting means provided in the cleaning head, for jetting out a rinse liquid; third sucking means provided in the vicinity of the third jetting means, for sucking the rinse liquid; drying means for drying the processing-subject; and control means for controlling the moving means, the first jetting means, the second jetting means, and the third jetting means and thereby blowing the first cleaning agent, the second cleaning agent, and the rinse liquid selectively over a pattern-forming portion of the processing-subject.

This invention, configured as above, can reduce the amounts of cleaning liquids and rinse liquid used to a large extent because the first cleaning agent for removing organic substances, the second cleaning agent for removing inorganic substances, and the rinse liquid can be supplied, selectively and reliably, to the pattern-forming portion that needs to be cleaned of the substrate, and hence cleaning of unnecessary portions can be avoided. Further, since the cleaning is performed by moving the cleaning head, no large cleaning tanks or substrate transport apparatus is needed even if the processing-subject such as a substrate becomes large. Therefore, the cleaning equipment (cleaning facilities) can be reduced in scale, and the space can be saved.

The first jetting means may comprise a first gas nozzle for jetting out a first reactive gas capable of reacting with the organic substance, and a first liquid nozzle for jetting out a first dissolving liquid capable of dissolving the first reactive gas in itself. This makes it possible to increase the amount of substance that reacts with organic substances such as a substance that oxidizes organic substances, whereby organic substances can be removed quickly. The second jetting means may comprise a second gas nozzle for jetting out a second reactive gas capable of reacting with the inorganic substance, and a second liquid nozzle for jetting out a second dissolving liquid capable of dissolving the second reactive gas in itself. This makes it possible to increase the amount of supply of a substance capable of etching inorganic substances, and prevent the liquid nozzles from being corroded (damaged) by cleaning liquids such as etching liquids.

The drying means may comprise illuminating means for illuminating the pattern-forming portion with ultraviolet light. This makes it possible to decompose and remove organic substances by ultraviolet light when organic substances remain on the processing-subject.

A device manufacturing method according to the invention is characterized by comprising the step of removing unnecessary substances sticking to a surface of the processing-subject, by one of the processing-subject cleaning methods described above. This makes it possible to reduce the amounts of cleaning agents and the energy that is consumed by the cleaning, and to reduce loads on the environment accompanying with device manufacturing.

A device according to the invention is characterized by being manufactured by using one of the cleaning apparatuses described above. This makes it possible to reduce the amounts of cleaning agents and the energy that are consumed to manufacture the device, and to reduce loads on the environment and the device cost.

DETAILED DESCRIPTION OF PREFERRED EMBODIMENTS

Processing-subject cleaning methods and apparatuses, and device manufacturing methods and devices according to preferred embodiments of the present invention will be hereinafter described in detail with reference to the accompanying drawings.

Figure 2:
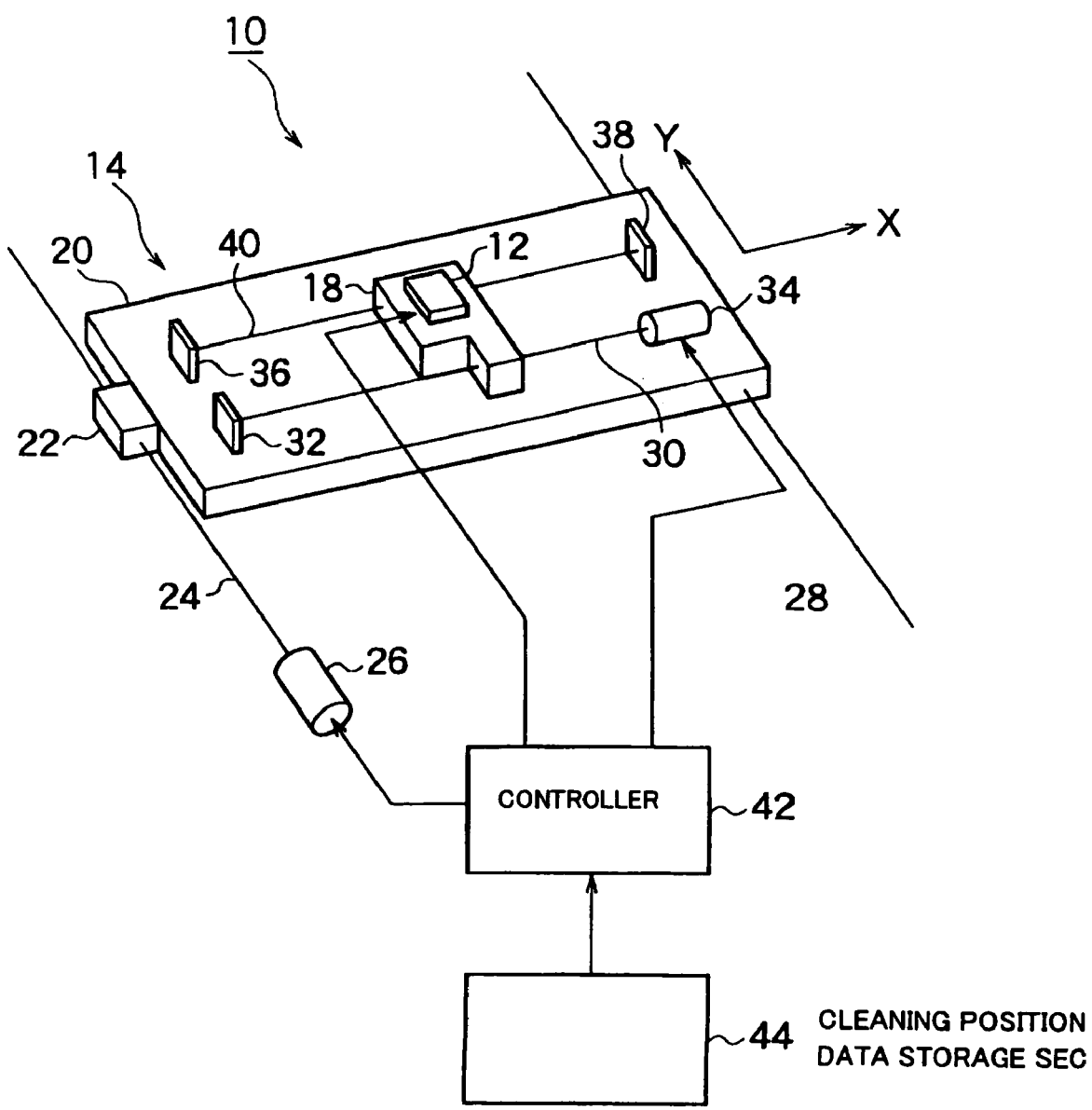
FIG. 2 is a perspective view, as viewed from below, of an important part of a cleaning apparatus according to the first embodiment of the invention.

FIG. 2 is a perspective view, as viewed from below, of the important part of a cleaning apparatus according to a first embodiment of the invention. As shown in FIG. 2, a cleaning apparatus 10 is equipped with a cleaning head 12, which will be described later in detail. Mounted on what is called an XY table 14, the cleaning head 12 can be moved parallel with the surface of a substrate of a semiconductor substrate, a glass substrate or the like (not shown in this figure), that is, the surface of a processing-subject.

The XY table 14 is composed of an X table 18 and a Y table 20 on which the X table 18 is mounted. A cleaning head 12 is fixed to the X table 18, and a liquid storage unit (not shown) in which a cleaning liquid, a rinse liquid etc. is stored, is mounted on the X table 18. On the other hand, mounted on a Z table (not shown), the Y table 20 can be moved together with the Z table in the vertical direction that is perpendicular to the surface of the Y table 20. A nut unit 22 that is provided at one end of the Y table 20 is threadedly engaged with a ball-thread screw 24.

One end of the ball-thread screw 24 is rotatably supported by a bracket that is provided on the Z table. The other end of the ball-thread screw 24 is connected to a Y servo motor 26 that is provided on the Z table. A guide bar 28 that is provided on the Z table slidably penetrates through the other end portion of the Y table 20. The guide bar 28 is disposed parallel with the ball-thread screw 24. Therefore, the Y table 20 is moved in the Y direction along the ball-thread screw 24 when the ball-thread screw 24 is rotated by driving the Y servo motor 26.

A ball-thread screw 30 is provided on the Y table 20 so as to extend in the X direction that is perpendicular to the ball-thread screw 24. The ball-thread screw 30 is threadedly engaged with the X table 18. One end of the ball-thread screw 30 is rotatably supported by a bearing 32 that is attached to the Y table 20, and the other end is connected to an X servo motor 34 that is attached to the Y table 20. The X servo motor 34, the Y servo motor 26, the X table 18, the Y table 20, etc. constitute a moving means for moving the cleaning head 12 parallel with the surface of a substrate.

A guide bar 40 is provided on the Y table 20 via brackets 36 and 38 parallel with the ball-thread screw 30. Slidably penetrating through one end portion of the X table 18, the guide bar 40 guides the X table 18 in the X direction while preventing rotation of the X table 18. Therefore, the X table 18 is moved in the X direction along the ball-thread screw 30 when the ball-thread screw 30 is rotated by driving the X servo motor 34.

The Y servo motor 26, the X servo motor 34, and the cleaning head 12 are connected to a controller 42 that is a control means, and are drive-controlled by the controller 42. A cleaning position data storage section 44, in which positions of portions to be cleaned, are stored is also connected to the controller 42. The controller 42 reads out data stored in the cleaning position data storage section 44, and selectively cleans prescribed portions of a substrate by moving the cleaning head 12 parallel with the substrate surface and controlling the operation of the cleaning head 12.

Figure 3:
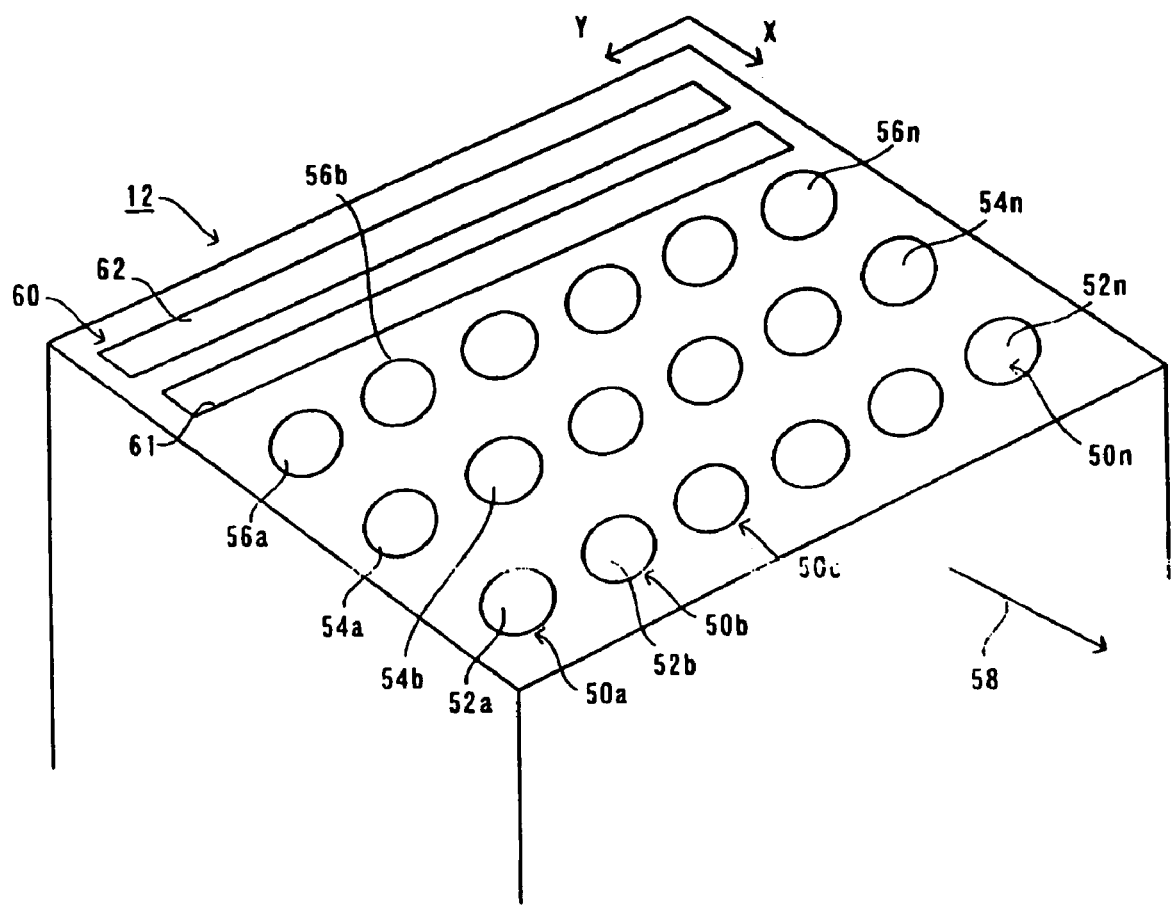
FIG. 3 is a schematic perspective view of an important part of the cleaning head according to the first embodiment.

As shown in FIG. 3, the cleaning head 12 has a plurality of cleaning units 50 (50*a* to 50*n*), which, in this embodiment, are arranged in the Y direction at regular intervals. Although FIG. 3 shows the cleaning head 12 having six cleaning units, the invention is not limited to such a case.

Each cleaning unit 50 has an organic substance cleaning portion 52 (52*a* to 52*n*), an inorganic substance cleaning portion 54 (54*a* to 54*n*), and a rinse portion 56 (56*a* to 56*n*), each of which will be described later in detail. The organic substance cleaning portion 52, the inorganic substance cleaning portion 54, and the rinse portion 56 are arranged in this order straightly in the X direction that is the moving direction of the cleaning head 12 during cleaning, as indicated by arrow 58 in FIG. 3. The cleaning head 12 is formed with a hot wind blowing-out mouth (wind blowing mouth) 61 of a drying unit 60 as a drying means in the rear of the cleaning units 50. In this embodiment, the hot wind blowing-out mouth 61 assumes a rectangle whose long sides extend in the Y direction and has such a length as to cover the range where the cleaning units 50 are provided. Although in this embodiment a hot wind is blown out of the blowing mouth, the invention is not limited to such a case; a means capable of drying a subject by blowing an ordinary-temperature wind over it may also be used.

The drying unit 60 is also provided, in the rear of the hot wind blowing-out mouth 61, with a light guide 62 that is an illuminating means. The tip (illumination mouth) of the light guide 62 extends in the Y direction like the hot wind blowing-out mouth 61, whereby the light guide 62 can illuminate, with ultraviolet light, a portion of a substrate over which a hot wind coming from the hot wind blowing-out mouth 61 is blown.

Figure 1:
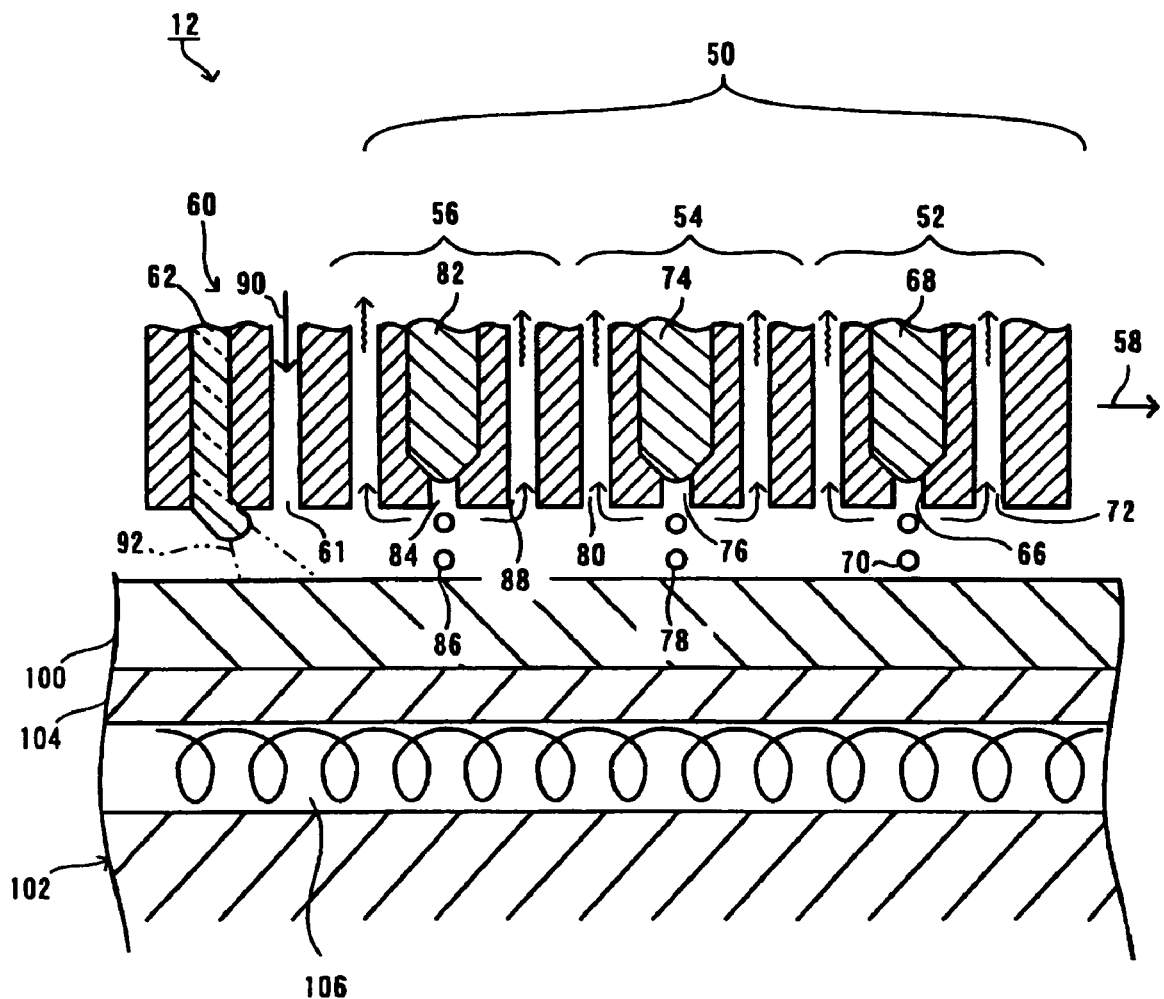
FIG. 1 is a partial sectional view of a cleaning head according to a first embodiment of the present invention.

The organic substance cleaning portion 52, the inorganic substance cleaning portion 54, and the rinse portion 56 of the cleaning head 12 are configured as shown in FIG. 1. That is, the tip portion of each of the organic substance cleaning portion 52, the inorganic substance cleaning portion 54, and the rinse portion 56 has a double-tube structure. The organic substance cleaning portion 52 is provided with a first nozzle 66 that is constituting first jetting means. A first cleaning agent 68 such as an organic substance peeling liquid, ozone water or the like, capable of peeling off organic substances, is jetted out of the first nozzle 66 in the form of fine particles 70, whereby the first cleaning liquid 68 can be blown over at a prescribed position of a substrate 100. In the organic substance cleaning portion 52 of the cleaning head 12, a first suction mouth (first sucking means) 72 is provided around the first nozzle 66. The first suction mouth 72 sucks reaction products of a reaction between organic substances on the surface of the substrate 100 and the first cleaning agent 68, jetted out of the first nozzle 6 and being blown over the surface of the substrate 100 as a processing-subject, 6, and the first cleaning agent 68 transpiring from the surface of the substrate 100.

Provided with a second nozzle (second jetting means) 76 that jets out a second cleaning agent 74 such as a hydrofluoric acid solution, the inorganic substance cleaning portion 54 blows fine particles 78 of the second cleaning agent 74 over the surface of the substrate 100. In the inorganic substance cleaning portion 54, a second suction mouth (second sucking means) 80 is formed around the second nozzle 76. The second suction mouth 80 sucks reaction products of a reaction between inorganic substances on the surface of the substrate 100 and the second cleaning agent 74, a vapor of the second cleaning agent 74 evaporating from the surface of the substrate 100, and other substances.

Having a third nozzle (third jetting means) 84 that jets out pure water 82 as a rinse liquid, the rinse portion 56 blows fine particles 86 of the pure water 82 over the surface of the substrate 100. Provided around the third nozzle 84, a third suction mouth (third sucking means) 88 can suck a vapor of the pure water 82 evaporating from the surface of the substrate 100.

In this embodiment, liquid jetting devices as jetting means for jetting out the fine particles 70, 78, and 86 of the first cleaning agent 68, the second cleaning agent 74, and the pure water 82 from the first nozzle 66, the second nozzle 76, and the third nozzle 84 are configured in the same manner as in a printer head of an ink jet printer, and are constant amount jetting mechanisms capable of jetting out constant amounts of fine particles 70, 78, and 86 by means of piezoelectric elements or the like. In this embodiment, the fine particles 70, 78, and 86 that are jetted out of the respective nozzles 66, 76, and 84 have diameters approximately in a range of 10 to 100 μm, and hence can easily evaporate. The liquid jetting device that can be used in the invention is not limited to the ink jetting head using piezoelectric elements; a thermal ink jet type head utilizing thermal expansion, and a head utilizing electrostatic attraction may also be used.

As described later, the hot wind blowing-out mouth 61 of the drying unit 60 dries the surface of the substrate 100 by accelerating evaporation of the pure water 82 by blowing a heated gas 90, such as heated air, to a portion of the substrate 100 over which the pure water 82 was blown. The light guide 62, the illuminating means, illuminates ultraviolet light 92 emitted from an ultraviolet lamp (not shown) to a portion of the substrate 100 over which the heated gas 90 is blown, and thereby decomposes residual organic substances.

On the other hand, in a table 102 on which the substrate 100 is mounted, a table main body 104 incorporates a heater 106 that is a heating means. The substrate 100 is heated to a prescribed temperature (e.g., 30° C. to 60° C.), whereby the removal reactions involving the cleaning agents 68 and 74 are accelerated, and the evaporation of the cleaning agents 68 and 74 remaining on the surface of the substrate 100 is also made faster.

The above-configured cleaning apparatus 10 according to the embodiment operates in the following manner.

The substrate 100 to be cleaned is placed on the table 102 and heated to a prescribed temperature by the heater 106. Position of portions to be cleaned of the substrate 100 are stored in the cleaning position data storage section 44. For example, the portions to be cleaned are portions of the substrate 100 corresponding to what is called pattern-forming positions where circuit elements, interconnections, etc. will be formed.

Upon activation of the cleaning apparatus 10, the controller 42 as the control means moves the cleaning head 12 to a prescribed initial position via the XY table 14. Then, the controller 42 reads the positions of the portions to be cleaned from the cleaning position data storage section 44, moves the cleaning head 12 in the X direction as indicated by arrow 58 in FIG. 3 by driving the X servo motor 34, and stops the organic substance cleaning portions 52 of the cleaning head 12 at a position corresponding to a portion to be cleaned (pattern-forming position) of the substrate 100. Then, the controller 42 operates each first jetting means so that it jets out the first cleaning agent 68 such as a peeling liquid or ozone water in the form of fine particles 70 from the first nozzle 66, and blows the first cleaning agent 68 over the portion to be cleaned of the substrate 100. At this time, the controller 42 does not operate the jetting means of part of the organic substance cleaning portions 52 that do not correspond to the portion to be cleaned of the substrate 100. As a result, only the pattern-forming portion of the substrate 100 that needs be cleaned is cleaned, and the portions, where pattern is not formed and no need of cleaning, are not cleaned.

The fine particles of the first cleaning agent 68, being blown over the surface of the substrate 100, peel off organic substances on the substrate surface, or react with the organic substances to oxidize those. Organic substances that have been peeled off from the substrate surface, or reaction products of a reaction between the first cleaning agent 68 and organic substances, and a vapor of the first cleaning agent 68 are sucked into the first suction mouth 72, and thereby removed from the surface of the substrate 100 and its vicinity. Further, in this embodiment, since the substrate 100 is heated to the prescribed temperature by the heater 106 which is incorporated in the table 102, the peeling of organic substances, and the reaction between organic substances and the first cleaning agent 68 are accelerated, and the evaporation of the first cleaning agent 68 remaining on the surface of the substrate 100 is made faster, leaving no influences on the subsequent cleaning of inorganic substances.

Where the cleaning region of the substrate is wide and the cleaning head 12 needs to be moved also in the Y direction, the controller 42 moves the cleaning head 12 in the Y direction via the Y table 20 by driving the Y servo motor 26.

After causing the organic substance cleaning portions 52 to perform the cleaning for removing organic substances for a prescribed time, the controller 42 moves the cleaning head 12 in the X direction, and stops the inorganic substance cleaning portions 54 at the position corresponding to the portion to be cleaned of the substrate 100 from which organic substances have been removed by the organic substance cleaning portions 52. The controller 42 operates the jetting mechanism of second jetting means so that it jets out fine particles 78 of the second cleaning agent 74 from the second nozzle 76, and blows the second cleaning agent 74 over the surface of the substrate 100. The second cleaning agent 74 reacts with unnecessary inorganic substances stuck to the surface of the substrate 100 and etches them away. Reaction products of a reaction between the second cleaning agent 74 and inorganic substances, and a vapor of the second cleaning agent 74 that have evaporated from the surface of the substrate 100, are sucked into the second suction mouth and thereby removed. The controller 42 does not operate part of the inorganic substance cleaning portions 54 that correspond to the organic substance cleaning portions 52 that did not jet out the first cleaning agent 68.

After causing the inorganic substance cleaning portions 54 to perform the cleaning for removing inorganic substances for a prescribed time, the controller 42 moves the cleaning head 12 further in the X direction, and stops the rinse portions 56 at the position corresponding to the portion to be cleaned of the substrate 100 from which inorganic substances have been removed. The controller 42 operates the jetting mechanism of third jetting means so that it blows pure water 82 over the surface of the substrate 100, thereby to rinse the portion to be cleaned of the substrate 100 from which inorganic substances have been removed. The pure water 82, blown over the substrate 100 in the form of fine particles 86, is evaporated by heat of the substrate 100 being heated and is sucked into the third suction mouth 88.

After completion of the rising with the pure water 82, the controller 42 moves the cleaning head 12 further in the X direction, and stops the hot wind blowing-out mouth 61 as the drying means at the position corresponding to the portion to be cleaned of the substrate 100 that have been rinsed. A heated gas 90 such as heated air is blown from the hot wind blowing-out mouth 61 over the portion to be cleaned of the substrate 100 so as to dry the surface of the substrate 100 completely, and the cleaning of this portion is finished. During the drying with the heated gas 90, the portion to be cleaned of the substrate 100 over which the heated gas 90 is blowing is illuminated with ultraviolet light 92 via the light guide 62, whereby residual organic substances are removed.

After completion of the cleaning of the region of the substrate 100 having a prescribed width in the X direction, the controller 42 shifts the cleaning head 12 in the Y direction by a prescribed distance and then returns it to the cleaning start position. The substrate 100 is then cleaned in the same manner as described above.

As described above, in this embodiment, only portions that should be cleaned of the substrate 100 are cleaned. Therefore, a cleaning agent (cleaning liquid) is saved, and the amount of use of pure water 82 necessary for rinsing can be reduced to a large extent. Further, since the substrate 100 is cleaned by moving the cleaning head 12, no large cleaning tanks or transport apparatus is needed even if the size of the substrate 100 is increased. As a result, the installation space can be made very small, and the energy for maintaining a prescribed temperature of a cleaning agent can be reduced greatly.

Although the above embodiment is described in the case that the heated gas 90 is air, an inert gas such as a heated nitrogen gas may be used as the heated gas 90 in the case where it is desired to prevent oxidation of the substrate 100 after cleaning. As another alternative, residual organic substances may be removed by using a heated gas containing ozone or radical oxygen as the heated gas 90. Although in the above embodiment, ultraviolet light 92 is illuminated to the portion of the substrate 100 over which the heated gas 90 is being blown, the illumination of ultraviolet light 92 may be performed on a portion (pattern-forming portion) that needs to be cleaned and is not the potion over which the heated gas 90 is being blown. Although the above embodiment is described in the case that the rinse liquid is water, the rinse liquid may be another liquid such as alcohol. In the cleaning head 12, if necessary, a heat insulation member may be disposed around the flow path of the heated gas 90. The first cleaning agent 68, the second cleaning agent 74, and the pure water 82 may be jetted out after being heated to desired temperatures. Although the above embodiment is described in the case that the substrate 100 is heated by the heater 106, a modification is possible in which the substrate 100 is not heated and a cleaning liquid etc. remaining on the surface of the substrate 100 are sucked away in a liquid state. Although the above embodiment is described in the case that the light guide 62 radiates ultraviolet light 92 from the front side of the cleaning head 12, an ultraviolet lamp or the like may be provided on the front side of the cleaning head 12.

The above embodiment is described in the case that organic substances and inorganic substances are removed by the first cleaning agent 68 and the second cleaning agent 74, and then rinsing with the pure water 82 is performed. However, the invention can also be applied to a case that cleaning is performed by using only pure water or an organic solvent. In this case, it is sufficient for the cleaning head 12 to have one of the organic substance cleaning portions 52, the inorganic substance cleaning portions 54, or the rinse portions 56. Although the above embodiment is described in the case that the first cleaning agent 68 is an organic peeling liquid or ozone water, it may be a mixture of ozone water and ozone. Although the above embodiment is directed in the case that the second cleaning agent 74 is an aqueous solution of hydrofluoric acid, it may be a mixture of an aqueous solution of hydrofluoric acid and hydrogen fluoride (HF), or a mixture of chlorine water and chlorine.

Figure 4:
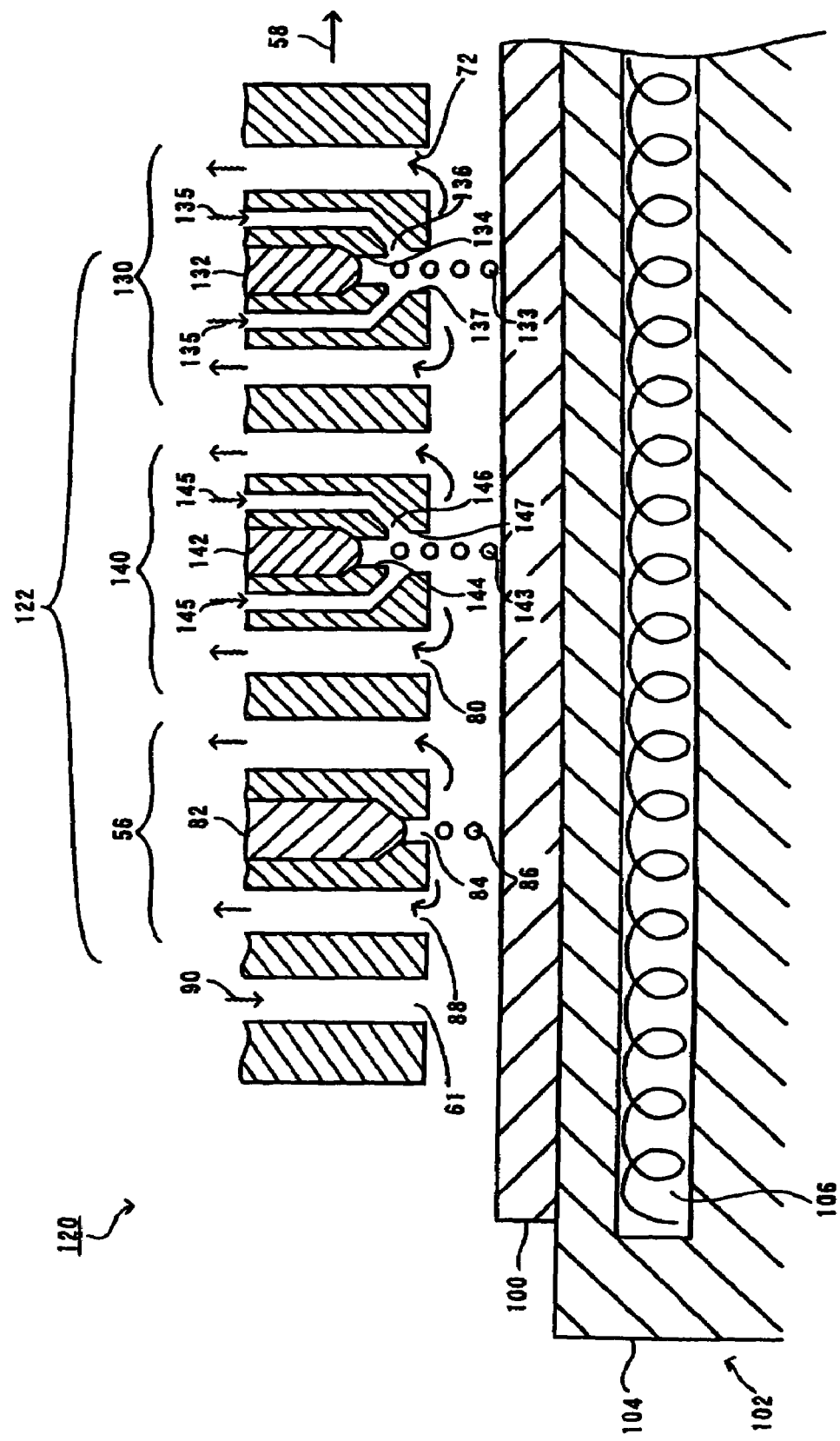
FIG. 4 is a sectional view of a cleaning head according to a second embodiment of the invention.

FIG. 4 illustrates an important part of a cleaning apparatus according to a second embodiment of the invention and is a sectional view of a cleaning head. The cleaning head 120 according to the embodiment has a plurality of cleaning units 122, and a hot wind blowing-out mouth 61. Each cleaning unit 122 is composed of an organic substance cleaning portion 130, an inorganic substance cleaning portion 140, and a rinse portion 56 that are arranged in this order in a moving direction of the cleaning head 12 which is indicated by arrow 58.

The tip portion of the organic substance cleaning portion 130 assumes a triple-tube structure, in which a first liquid nozzle 134 for jetting out a first dissolving liquid 132 such as pure water in the form of fine particles 133, is provided at the center portion. In the organic substance cleaning portion 130, a first gas nozzle 136, for jetting out a first reactive gas 135 such as ozone capable of oxidizing organic substances, is provided around the first liquid nozzle 134. The first gas nozzle 136 has an opening in front of the tip of the first liquid nozzle 134. A first jetting mouth 137 is provided in front of the tip of the first gas nozzle 136. The fine particles 133 of the first dissolving liquid 132, and the first reactive gas 135 are jetted through the first jetting mouth 137, and blown over the surface of a substrate 100. A first suction mouth 72 is provided around the first jetting mouth 137 to make it possible to suck away reaction products and a vapor of the first dissolving liquid 132.

The inorganic substance cleaning portion 140 is configured in the same manner as the organic substance cleaning portion 130. A second liquid nozzle 144, for jetting out a second dissolving liquid 142 such as pure water or alcohol in the form of fine particles 133, is provided at the center portion. A second gas nozzle 146 is provided around the second liquid nozzle 144 and jets a second reactive gas 145, such as HF or $Cl_2$ capable of reacting with inorganic substances, to the portion in front of the second liquid nozzle 144. A second jetting mouth 147 is provided in front of the tip of the second gas nozzle 146. The fine particles 143 of the second dissolving liquid 142 and the second reactive gas 145 can be jetted through the second jetting mouth 147 and blown over the surface of the substrate 100. A second suction mouth 80, through which to suck away reaction products and a vapor of the second dissolving liquid 142, is provided around the second jetting mouth 147.

Jetting mechanisms for jetting out the fine particles 133 and 143 from the first liquid nozzle 134 and the second liquid nozzle 144 are configured in the same manner as in a printer head of an ink jet printer, and are constant amount jetting mechanisms using piezoelectric elements or the like. The rinse portion 56 is configured in the same manner as in the above embodiment. Although not shown in FIG. 4, a light guide for radiating ultraviolet light may be provided in the same manner as in the above embodiment.

In the above-configured second embodiment, the controller 42 moves the organic substance cleaning portions 130 of the cleaning units 122 to a position corresponding to a portion to be cleaned of the substrate 100 via the XY table 14. Then, the controller 42 controls the jetting mechanism of first liquid nozzle 134 to jet out the first dissolving liquid 132 such as pure water in the form of fine particles 133, and opens an opening/closing valve (not shown) to jet out the first reactive gas 135 such as ozone from the first gas nozzle 136. The fine particles 133 of the first dissolving liquid 132 that are jetted out of the first liquid nozzle 134 collide with the surface of the substrate 100 while dissolving part of the first reactive gas 135 in itself, and ionizes and activates it and thereby allows it to react with organic substances.

Reaction products produced by this reaction and a vapor of the first dissolving liquid 132 are sucked through the first suction mouth 72 and thereby removed from the surface of the substrate 100.

Upon completion of the cleaning for removing organic substances by the organic substance cleaning portions 130, the controller 42 moves the cleaning head 120 in the direction indicated by arrow 58, and stops the inorganic substance cleaning portions 140 at the position corresponding to the portion to be cleaned of the substrate 100. Then, the controller 42 operates each second liquid nozzle to jet out the second dissolving liquid 142 such as pure water or alcohol in the form of fine particles and operates each second gas nozzle 146 to jet out the second reactive gas 145 such as HF. The second dissolving liquid 142 dissolves part of the second reactive gas 145 in itself. The fine particles 143 and the second reactive gas 145 are jetted out of the second jetting mouth 147 and collide with the surface of the substrate 100. During that course, the second reactive gas 145 dissolves in the fine particles 143 and is ionized, and thereby reacts with and etches inorganic substances existing on the surface of the substrate 100. Resulting reaction products and a vapor of the second dissolving liquid 142 are sucked away through the second suction mouth 80.

Although the above embodiment is described in the case that the reactive gases 135 and 145 are jetted from around the respective liquid nozzles 134 and 144, each of the reactive gases 135 and 145 may be jetted from one side of the liquid nozzle 134 or 144. It is preferable that the tip portions of the cleaning heads 12 and 122 be covered with a fluorocarbon resin film to prevent them from being corroded by cleaning agents.

The cleaning method and apparatus according to the invention can be applied to manufacturing methods of such devices as color filters, organic EL (electro luminescence) devices, and semiconductor devices. That is, the application of the invention is preferable in the case where manufacturing methods of devices of the above kind include a step of cleaning a substrate-to-be-processed.

For example, the cleaning method and apparatus according to the invention can be applied to a case of cleaning such as dust, unnecessary organic and inorganic substances etc. adhered on a substrate such as a glass substrate or banks, before or after formation of the banks when R, G, and B inks are formed on the substrate by liquid jetting means in color filter manufacture.

It is needless to say that the cleaning method and apparatus according to the invention can also be applied as desired to manufacturing processes of other devices in the case where a cleaning step is necessary. What can be cleaned by the cleaning method and apparatus according to the invention are not limited to substrates, and they can also be applied to cleaning of other processing-subjects.

ADVANTAGES OF THE INVENTION

As described above, according to the invention, since only portions of a substrate that need to be cleaned are cleaned selectively, the amounts of cleaning liquids and rinse liquid used can be reduced to a large extent, and the energy consumption can also be reduced.

What is claimed is:

1. A processing-subject cleaning method, comprising:
    removing, in an organic substance cleaning portion, an organic substance by blowing a first cleaning agent through a first nozzle selectively over a pattern-forming portion of a processing-subject;
    removing, in an inorganic substance cleaning portion, an inorganic substance by blowing a second cleaning agent through a second nozzle different from the first nozzle selectively over the pattern-forming portion;
    blowing a rinse liquid, in a rinse portion, through a third nozzle different from the first and second nozzles selectively over the pattern-forming portion and removing the rinse liquid; and
    drying a portion of the process-subject over which the rinse liquid was blown using a wind blowing unit located behind the first, second and third nozzles;
    at least one of the removing an organic substance, the removing an inorganic substance, and the blowing of the rinse liquid being performed by a liquid jetting device;
    providing a single cleaning head comprising the first, second and third nozzles;
    wherein the organic substance cleaning portion, the inorganic substance cleaning portion and the rinse portion are arranged in this order, along a straight path, in a moving direction of the single cleaning head that moves along a direction substantially parallel to a surface of the processing-subject.

2. The processing-subject cleaning method according to claim 1, the blowing the rinse liquid being executed after each of the removing an organic substance and the removing an inorganic substance has been executed plural times.

3. The processing-subject cleaning method according to claim 1, the first cleaning agent being a mixture of a first reactive gas, capable of reacting with the organic substance, and a first dissolving liquid, capable of dissolving the first reactive gas in itself.

4. The processing-subject cleaning method according to claim 1, the second cleaning agent being a mixture of a second reactive gas, capable of reacting with the inorganic substance, and a second dissolving liquid, capable of dissolving the second reactive gas in itself.

5. The processing-subject cleaning method according to claim 1, the first cleaning agent being a first reactive gas that is blown over the pattern-forming portion and can react with the organic substance, and a first dissolving liquid that is blown over the pattern-forming portion and can dissolve the first reactive gas in itself.

6. The processing-subject cleaning method according to claim 1, the second cleaning agent being a second reactive gas that is blown over the pattern-forming portion and can react with the inorganic substance, and a second dissolving liquid that is blown over the pattern-forming portion and can dissolve the second reactive gas in itself.

* * * * *